(12) United States Patent
Mate et al.

(10) Patent No.: US 10,993,064 B2
(45) Date of Patent: Apr. 27, 2021

(54) APPARATUS AND ASSOCIATED METHODS FOR PRESENTATION OF AUDIO CONTENT

(71) Applicant: Nokia Technologies Oy, Espoo (FI)

(72) Inventors: Sujeet Shyamsundar Mate, Tampere (FI); Arto Lehtiniemi, Lempäälä (FI); Miikka Tapani Vilermo, Siuro (FI)

(73) Assignee: Nokia Technologies Oy, Espoo (FI)

( * ) Notice: Subject to any disclaimer, the term of this patent is extended or adjusted under 35 U.S.C. 154(b) by 15 days.

(21) Appl. No.: 16/687,836

(22) Filed: Nov. 19, 2019

(65) Prior Publication Data

US 2020/0186953 A1 Jun. 11, 2020

(30) Foreign Application Priority Data

Dec. 6, 2018 (EP) .................................... 18210878

(51) Int. Cl.
*H04R 1/20* (2006.01)
*H04S 7/00* (2006.01)
(Continued)

(52) U.S. Cl.
CPC .............. *H04S 7/303* (2013.01); *G06F 3/013* (2013.01); *G06F 3/017* (2013.01);
(Continued)

(58) Field of Classification Search
CPC .. H04R 1/20; H04R 2430/03; H04R 2430/20; H04R 2203/12; H04S 7/30; H04S 7/302; H04S 2420/11; H03G 3/24; G10L 19/167
(Continued)

(56) References Cited

U.S. PATENT DOCUMENTS

| 2010/0119072 A1 | 5/2010 | Ojanpera |
| 2013/0251157 A1* | 9/2013 | Munch ..................... H04R 5/04 381/17 |

(Continued)

FOREIGN PATENT DOCUMENTS

| EP | 3264222 A1 | 1/2018 |
| WO | 2018/197748 A1 | 11/2018 |

OTHER PUBLICATIONS

Taghizadeh et al., "Microphone Array Beampattern Characterization for Hands-free Speech Applications", IEEE 7th Sensor Array and Multichannel Signal Processing Workshop (SAM), Jun. 17-20, 2012, pp. 1-4.

(Continued)

*Primary Examiner* — Vivian C Chin
*Assistant Examiner* — Ubachukwu A Odunukwe
(74) *Attorney, Agent, or Firm* — Nokia Technologies Oy

(57) ABSTRACT

An apparatus comprising means configured to: receive first audio content from a remote apparatus, the audio content comprising at least one audio stream associated with respective location information; present the audio stream as spatial audio to be perceived as originating from a respective perceived-direction based on the location information; determine a user input direction to identify one of the audio streams; transmit a message to the remote apparatus identifying the identified audio stream; receive second audio content comprising an enhanced version of the at least one identified audio stream; present the enhanced version of the identified audio stream as spatial audio, wherein the perceived-direction of the identified audio stream is offset from the second perceived-direction of the enhanced version of the identified audio stream.

20 Claims, 6 Drawing Sheets

(51) Int. Cl.
| | |
|---|---|
| *H03G 3/20* | (2006.01) |
| *G10L 15/22* | (2006.01) |
| *G10L 19/16* | (2013.01) |
| *G06F 3/01* | (2006.01) |
| *G06F 3/16* | (2006.01) |
| *H04R 1/32* | (2006.01) |
| *G06F 3/0488* | (2013.01) |
| *G10L 19/008* | (2013.01) |
| *H04W 84/04* | (2009.01) |

(52) U.S. Cl.
CPC .......... *G06F 3/04883* (2013.01); *G06F 3/165* (2013.01); *G10L 15/22* (2013.01); *G10L 19/008* (2013.01); *H04R 1/326* (2013.01); *G10L 2015/223* (2013.01); *H04S 2400/11* (2013.01); *H04S 2400/13* (2013.01); *H04S 2420/11* (2013.01); *H04W 84/042* (2013.01)

(58) Field of Classification Search
USPC .................................................. 381/310, 303
See application file for complete search history.

(56) References Cited

U.S. PATENT DOCUMENTS

2017/0076749 A1* 3/2017 Kanevsky ............... G06F 3/165
2017/0280208 A1 9/2017 Mishra et al.

OTHER PUBLICATIONS

Extended European Search Report received for corresponding European Patent Application No. 18210878.7, dated Apr. 5, 2019, 10 pages.

* cited by examiner

APPARATUS AND ASSOCIATED METHODS FOR PRESENTATION OF AUDIO CONTENT

TECHNICAL FIELD

The present disclosure relates to the field of presentation of audio content and, in particular, to the presentation of telecommunication audio, such as immersive telecommunication audio. The present disclosure also relates to associated apparatus, methods and computer programs.

BACKGROUND

Telecommunication or telephony systems are being developed that provide for more than monophonic capture and presentation of audio. The audio content of such telephony may comprise spatial audio. The presentation of such audio may require careful consideration to ensure the telecommunication is clear and effective.

The listing or discussion of a prior-published document or any background in this specification should not necessarily be taken as an acknowledgement that the document or background is part of the state of the art or is common general knowledge. One or more aspects/examples of the present disclosure may or may not address one or more of the background issues.

SUMMARY

In an aspect of the disclosure there is provided an apparatus, the apparatus comprising means configured to:
receive first audio content from a remote apparatus, the audio content comprising at least one audio stream, the or each audio stream associated with respective location information;
provide for presentation of the at least one audio stream as spatial audio such that the or each audio stream is to be perceived as originating from a respective perceived-direction based on the respective location information;
determine at least one direction indicated by a user input;
identify which of the one or more perceived-directions of the at least one audio streams correspond to the at least one direction determined from the user input to identify at least one of the at least one audio streams;
transmit a message to the remote apparatus, the message including at least identifying information for the at least one identified audio stream;
receive second audio content provided in response to the transmitted message by the remote apparatus, the second audio content comprising an enhanced version of the at least one identified audio stream, the enhanced version of the identified audio stream having a greater audio quality than the identified audio stream;
provide for presentation of the at least one audio stream, including the identified audio stream, as spatial audio such that the or each audio stream is to be perceived as originating from the respective perceived-direction based on the respective location information and the simultaneous presentation of the enhanced version of the identified audio stream as spatial audio such that it is to be perceived as originating from a second perceived-direction, wherein the perceived-direction of the identified audio stream is offset from the second perceived-direction of the enhanced version of the identified audio stream.

In one or more examples, the enhanced version of the at least one identified audio stream comprises audio captured from a direction relative to the remote apparatus that corresponds to the direction indicated by a user input and wherein said greater audio quality is provided by one or more of:
a greater audio encoding bit rate for audio captured from said direction relative to an audio encoding bit rate used for the audio of the identified, non-enhanced, audio stream; and
the focusing of a directional microphone toward said direction for capture of audio to form the enhanced version of the identified audio stream;
a greater sample rate for audio captured from said direction relative to a sample rate used for the audio of the identified, non-enhanced, audio stream an improved signal to noise ratio by the application of a noise removal algorithm for audio captured from said direction relative to a signal to noise ratio of the audio of the identified, non-enhanced, audio stream;
a dynamic range of the audio being compressed less or expanded for audio captured from said direction relative to the dynamic range of the audio of the identified, non-enhanced, audio stream;
the capture of audio in way that introduces less noise to improve the signal to noise ratio for audio captured from said direction relative to a signal to noise ratio of the audio of the identified, non-enhanced, audio stream;
a greater audio volume gain applied to the audio in said direction relative to the identified, non-enhanced, audio stream.

In one or more examples, the enhanced version of the identified audio stream of the second audio content includes associated location information, the location information indicative of a direction from which said enhanced version of the identified audio stream is to be perceived as originating when presented as spatial audio, said location information defining the second perceived-direction that is offset from the perceived-direction of the identified audio stream.

In one or more examples, the means are configured to:
receive a status indication indicative of whether or not the audio of the identified audio stream is currently above a threshold level; and
based on the status indication being indicative of the audio being below the threshold level, provide for presentation of the enhanced version of the identified audio stream as spatial audio such that it is to be perceived as originating from a perceived-direction that is the same as the perceived-direction of the identified audio stream; and
based on the status indication being indicative of the audio being above the threshold level, provide for presentation of the enhanced version of the identified audio stream as spatial audio such that it is to be perceived as originating from a perceived-direction that is offset from the perceived-direction of the identified audio stream.

In one or more examples, the enhanced version of the identified audio stream is temporally offset from the identified audio stream such that said presentation of the enhanced version of the identified audio stream repeats audio already provided for presentation from the identified audio stream.

In one or more examples, the determination of a direction indicated by the user input comprises one of or more of:
the determination of a direction of a swipe gesture on a user interface relative to a reference point;

the determination of a direction of a free space gesture of a user in a direction relative to said user;

the determination of an orientation of an audio head set relative to the one or more perceived-directions of the audio streams;

the determination of an orientation of a virtual-or-augmented reality device relative to the one or more perceived-directions of the audio streams;

the determination of a direction in which a user is looking; and the determination of a direction indicated by a voice command.

In one or more examples, one of:

the second audio content provided in response to the transmitted message replaces the first audio content and comprises the enhanced version of the identified audio stream and the at least one audio stream present in the first audio content including the identified, non-enhanced, audio stream; and the second audio content provided in response to the transmitted message comprises the enhanced version of the identified audio stream and is received along with the first audio content.

In one or more examples, the means are configured to:

receive a user input comprising a gesture;

select one of the one or more audio streams based on the gesture being directed in a direction corresponding to the perceived-direction from which that selected audio stream is to be perceived when presented as spatial audio;

determine a movement comprising the direction in which the gesture moves following said selection to cause at least rewinding of the selected audio stream such that said presentation of the audio stream is provided from a prior point in time during said selected audio stream.

In one or more examples the provision of the rewinding is based on the movement being to the left from the point of view of the user providing the user input. While a movement to the left may intuitively be associated with rewinding, it will be appreciated that other specific directions of movement may cause the rewinding.

In one or more examples, the means are configured to determine a measure of the movement of the gesture subsequent to said selection and wherein the amount of rewinding of the selected audio stream is based on said measure such that the greater the measure of the movement the greater the temporal amount the selected audio stream is rewound.

In one or more examples, the gesture comprises one of a gesture in space and a gesture on an input device.

In one or more examples, the means are configured to:

receive a user input comprising a gesture;

select one of the one or more audio streams based on the gesture being directed in a direction corresponding to the perceived-direction from which that selected audio stream is to be perceived when presented as spatial audio;

determine a movement comprising the direction in which the gesture moves following said selection to cause at least muting of the selected audio stream until one of a predetermined future point in time and a future point in time based on the amount of said movement.

In one or more examples, the perceived-direction of each of the audio streams is defined by a respective virtual object, each virtual object thereby having a location that defines from where the respective audio stream is to be perceived when presented as spatial audio, wherein the location of the virtual object defines a time point during the associated audio stream that is presented, wherein the means are configured to:

provide for presentation of the respective audio stream from a first time point during the audio stream based on the virtual object having a first location; and receive a user input that provides for selection and movement of one of the virtual objects to a second location;

determine a second time point during the selected audio stream associated with the selected virtual object, the second location defining said second time point and the second time point temporally spaced from the first time point;

provide for presentation of the audio stream associated with the selected virtual object as spatial audio such that it is to be perceived as originating from the second location and from the second time point during the audio stream.

In one or more examples, the spatial distance between the first location and the second location determines the temporal distance between the first time point and the second time point, such that the greater the spatial distance the greater the temporal distance.

In one or more examples, based on a direction of movement from the first location to the second location being in a first direction, the second time point is temporally ahead of the first time point; and based on the direction of movement from the first location to the second location being in a second direction substantially opposite to the first direction, the second time point is temporally behind the first time point.

In one or more examples, said presentation of the audio stream associated with the selected virtual object is provided simultaneously with the presentation of the one or more other audio streams of one or both of the first audio content and the second audio content.

In one or more examples, during said presentation of the audio stream associated with the selected virtual object the presentation of other audio streams of one or both of the first audio content and the second audio content is paused.

In one or more examples, the means are configured to, as the presentation of the audio stream associated with the selected virtual object progresses, modify the location of the selected virtual object such that a currently presented time point in the audio stream associated with the selected virtual object relative to the first time point is correspondingly indicated by the location of the virtual object relative to the first position.

In one or more examples, the selected audio stream is the enhanced version of the identified audio stream and in one or more examples may only comprise said enhanced version sent in response to said message.

In one or more examples one or more of the at least one audio streams are each associated with a respective one or more audio objects, the audio objects each having a location that defines the perceived-direction for each of the audio streams.

In one or more examples, said first audio content and the second audio content is provided as part of a telecommunication call between the apparatus and the remote apparatus.

In a further aspect there is provided a method, the method comprising:

receiving first audio content from a remote apparatus, the audio content comprising at least one audio stream, the or each audio stream associated with respective location information;

providing for presentation of the at least one audio stream as spatial audio such that the or each audio stream is to be perceived as originating from a respective perceived-direction based on the respective location information;

determining at least one direction indicated by a user input;

identifying which of the one or more perceived-directions of the at least one audio streams correspond to the at least one direction determined from the user input to identify at least one of the at least one audio streams;

transmitting a message to the remote apparatus, the message including at least identifying information for the at least one identified audio stream;

receiving second audio content provided in response to the transmitted message by the remote apparatus, the second audio content comprising an enhanced version of the at least one identified audio stream, the enhanced version of the identified audio stream having a greater audio quality than the identified audio stream;

providing for presentation of the at least one audio stream, including the identified audio stream, as spatial audio such that the or each audio stream is to be perceived as originating from the respective perceived-direction based on the respective location information and the simultaneous presentation of the enhanced version of the identified audio stream as spatial audio such that it is to be perceived as originating from a second perceived-direction, wherein the perceived-direction of the identified audio stream is offset from the second perceived-direction of the enhanced version of the identified audio stream.

It will be appreciated that all of the optional functional features of the first aspect apply to this further aspect.

In a further aspect there is provided a computer readable medium comprising computer program code stored thereon, the computer readable medium and computer program code being configured to, when run on at least one processor, perform the method of:

receiving first audio content from a remote apparatus, the audio content comprising at least one audio stream, the or each audio stream associated with respective location information;

providing for presentation of the at least one audio stream as spatial audio such that the or each audio stream is to be perceived as originating from a respective perceived-direction based on the respective location information;

determining at least one direction indicated by a user input;

identifying which of the one or more perceived-directions of the at least one audio streams correspond to the at least one direction determined from the user input to identify at least one of the at least one audio streams;

transmitting a message to the remote apparatus, the message including at least identifying information for the at least one identified audio stream;

receiving second audio content provided in response to the transmitted message by the remote apparatus, the second audio content comprising an enhanced version of the at least one identified audio stream, the enhanced version of the identified audio stream having a greater audio quality than the identified audio stream;

providing for presentation of the at least one audio stream, including the identified audio stream, as spatial audio such that the or each audio stream is to be perceived as originating from the respective perceived-direction based on the respective location information and the simultaneous presentation of the enhanced version of the identified audio stream as spatial audio such that it is to be perceived as originating from a second perceived-direction, wherein the perceived-direction of the identified audio stream is offset from the second perceived-direction of the enhanced version of the identified audio stream.

In a further example aspect there is provided an apparatus comprising:

at least one processor; and at least one memory including computer program code, the at least one memory and the computer program code configured to, with the at least one processor, cause the apparatus to perform at least the following:

receive first audio content from a remote apparatus, the audio content comprising at least one audio stream, the or each audio stream associated with respective location information;

provide for presentation of the at least one audio stream as spatial audio such that the or each audio stream is to be perceived as originating from a respective perceived-direction based on the respective location information;

determine at least one direction indicated by a user input;

identify which of the one or more perceived-directions of the at least one audio streams correspond to the at least one direction determined from the user input to identify at least one of the at least one audio streams;

transmit a message to the remote apparatus, the message including at least identifying information for the at least one identified audio stream;

receive second audio content provided in response to the transmitted message by the remote apparatus, the second audio content comprising an enhanced version of the at least one identified audio stream, the enhanced version of the identified audio stream having a greater audio quality than the identified audio stream;

provide for presentation of the at least one audio stream, including the identified audio stream, as spatial audio such that the or each audio stream is to be perceived as originating from the respective perceived-direction based on the respective location information and the simultaneous presentation of the enhanced version of the identified audio stream as spatial audio such that it is to be perceived as originating from a second perceived-direction, wherein the perceived-direction of the identified audio stream is offset from the second perceived-direction of the enhanced version of the identified audio stream.

The present disclosure includes one or more corresponding aspects, examples or features in isolation or in various combinations whether or not specifically stated (including claimed) in that combination or in isolation. Corresponding means and corresponding functional units (e.g., function enabler, processor, audio presenter, display device) for performing one or more of the discussed functions are also within the present disclosure.

Corresponding computer programs for implementing one or more of the methods disclosed are also within the present disclosure and encompassed by one or more of the described examples.

The above summary is intended to be merely exemplary and non-limiting.

BRIEF DESCRIPTION OF THE FIGURES

A description is now given, by way of example only, with reference to the accompanying drawings, in which.

DESCRIPTION OF EXAMPLE ASPECTS

Figure 1:
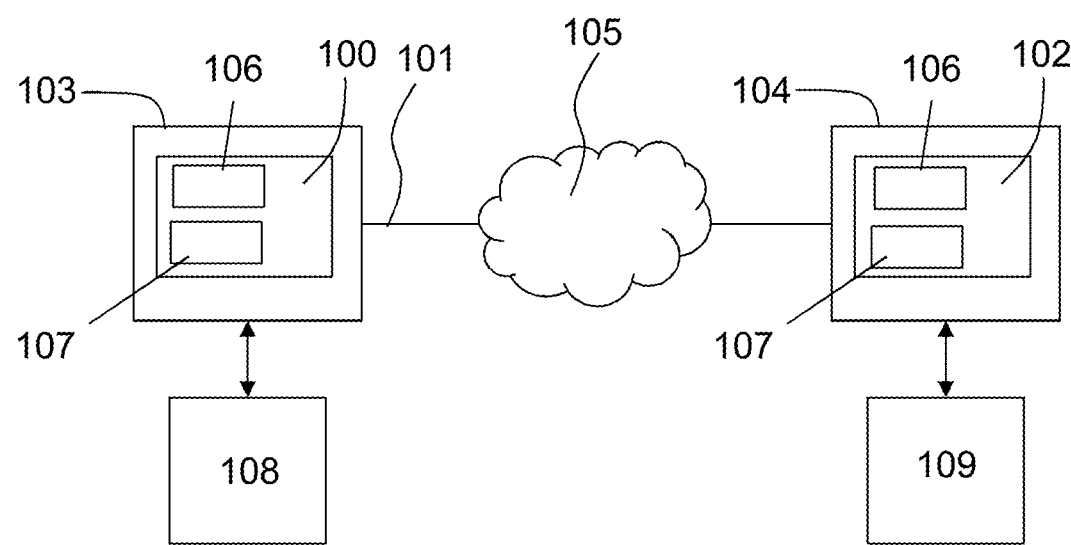
FIG. 1 illustrates an example apparatus for providing for presentation of audio as well as a remote apparatus.

Telecommunication or telephony systems are being developed that provide for more than monophonic capture and monophonic presentation of audio. Immersive telephony systems are being developed, such as by the 3rd Generation Partnership Project (3GPP), that will enable a new level of immersion in telephony services. Immersive telephony may comprise the use of spatial audio presentation techniques and the capture of spatial audio content in the provision of telecommunication between users. Such service can be realized, e.g., over a mobile 4G or 5G network by a multi-microphone spatial audio capture and processing, encoding in a suitable immersive audio format, transmission and decoding, and binaural or loudspeaker presentation. Such systems may provide for transmission of and presentation of immersive, spatial audio content, such as parametric spatial audio content. This may enable receiving and sending of an enveloping audio scene between apparatuses, such as from/to the telecommunication call participants or users. Thus, for example, when a remote user connects to a user, the user can experience the audio environment around the remote user as if he/she was physically located at the location of the remote user and vice versa. One or more examples herein may relate to such immersive telecommunication apparatus.

It will be appreciated that one or more of the examples herein relate to the provision of audio in the field of telecommunication, although it will be appreciated that the principles may be applied to other fields of audio presentation.

In one or more examples, one or more microphones or a microphone array may be used to capture audio content.

Thus, in one or more examples, a first microphone may be configured to detect a user's voice and one or more other microphones may be configured to detect audio from elsewhere. It will be appreciated that with multi-microphone arrangements the same audio may be detected by more than one microphone and therefore audio processing techniques may be used to separate the voice audio detected primarily by the first microphone from the audio detected by the other microphones. For example, if a mobile telephone is used to capture the audio, a microphone near the user's mouth may be configured to capture, primarily, the voice audio and a microphone(s) on the back of the mobile telephone may be configured to capture the ambient audio. In one or more examples, a single microphone may be used and audio processing algorithms may be used to separate the voice audio from any ambient noise to provide for categorized audio content, wherein such algorithms are known to those skilled in the art.

In one or more examples, the audio content may comprise spatial audio content that includes directional/location information such that, when presented using spatial audio presentation, it is perceived as originating from one or more directions in accordance with the directional information. With audio content that comprises spatial audio content, the direction from which audio was received at the location of the remote apparatus may be reproduced when presenting the audio content at an apparatus by use of spatial audio presentation. In one or more examples, the audio content may include ambient audio comprising audio without said directional information or without a direction of arrival distinguishable above a threshold level.

Spatial audio comprises audio that may be presented in such a way to a user that it is perceived to originate from a particular location or direction, as if the source of the audio was located at that particular location or direction. Spatial audio content comprises audio for presentation as spatial audio and, as such, typically comprises audio having directional information (either explicitly specified as, for example, metadata or inherently present in the way the audio is captured), such that the spatial audio content can be presented such that its component audio "streams" are perceived to originate from one or more points or one or more directions in accordance with the directional information. An example way to encode and deliver spatial audio for an immersive audio telecommunication call is to encode the user's voice and/or audio sources and ambience separately. Various encoding formats exist including, e.g., near-far stereo, First Order Ambisonics (FOA)/Higher Order Ambisonic (HOA) (+ objects), and other spatial audio encoding schemes.

In one or more examples, non-spatial audio content may be presented as spatial audio. Thus, "conventional" monophonic or stereophonic audio (or audio converted to such a format) may be provided for presentation such that it will be perceived to originate from a particular location or direction. One or more of the example embodiments described herein may present spatial audio based on spatial audio content or non-spatial audio content.

The spatial positioning of the spatial audio may be provided by spatial audio effects applied to the audio of the audio content. The spatial audio effects include 3D audio effects, such as those that utilise a head related transfer function to create a spatial audio space (aligned with a real-world space in the case of augmented reality) in which audio can be positioned for presentation to a user. Spatial audio may be presented by headphones by using head-related-transfer-function (HRTF) filtering techniques or, for loudspeakers, by using vector-base-amplitude panning techniques to position the perceived aural origin of the audio content. In other embodiments ambisonic audio presentation may be used to present spatial audio.

Spatial audio may use one or more spatial audio effects comprising volume differences, timing differences and pitch differences between audible presentation to each of a user's ears to create the perception that the origin of the audio is at a particular location or in a particular direction in space. The perceived distance to the perceived origin of the audio may be rendered by controlling the amount of reverberation and gain to indicate closeness or distance from the perceived source of the spatial audio. It will be appreciated that spatial audio presentation as described herein may relate to the presentation of audio with only a perceived direction towards its origin as well as the presentation of audio such that the origin of the audio has a perceived location, e.g. including a perception of distance from the user.

Figure 2:
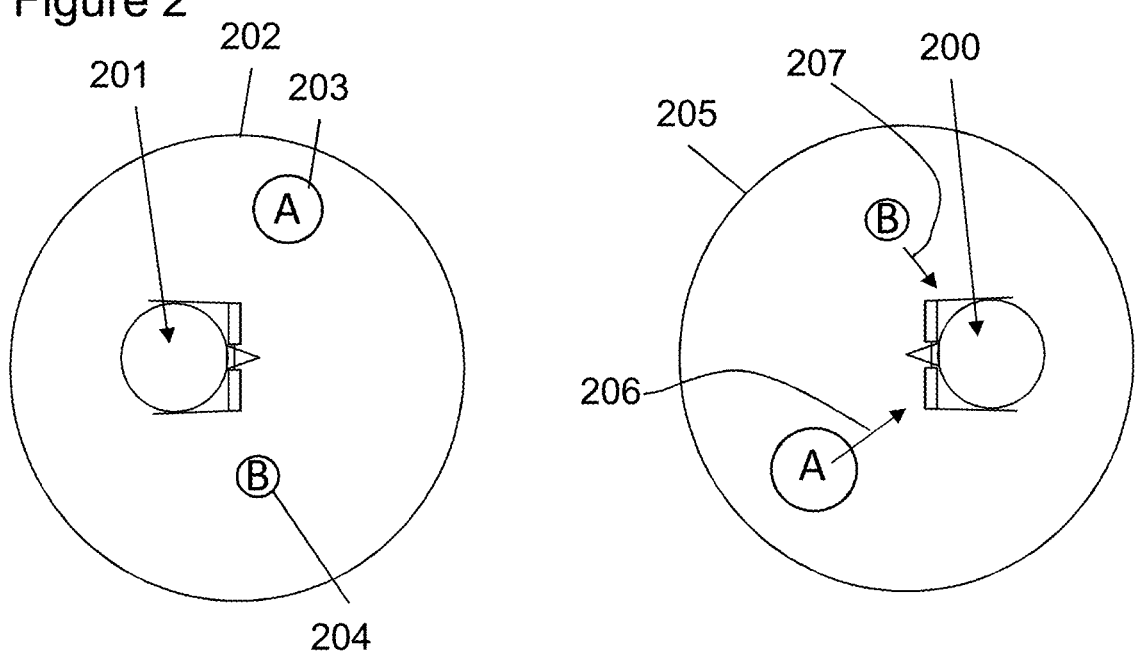
FIG. 2 illustrates an example plan view of a user of the apparatus and a user of the remote apparatus to illustrate from where they hear/perceive the audio of the audio streams.

Example FIG. 1 and example FIG. 2 shows an apparatus 100 that may be used to control or provide for the presentation of audio content to a user 200. The apparatus 100 may, but is not limited to having, application in the field of telecommunication. It will be appreciated that reference to telecommunication infers no limitation on how the audio content is delivered and may be delivered via traditional telephone networks, mobile or cell-phone based networks, data networks such as the Internet using voice over IP or any telephony service whether packet based or circuit switched. The apparatus 100 may include means to receive audio content or information about the receipt of audio content by another apparatus, such as an input 101. The input 101 may receive audio content, such as immersive audio content comprising one or more audio streams (e.g. individual instances of audio) from a remote apparatus 102. In other examples, the audio may be encoded together but separable into separate streams for presentation with different perceived locations/directions in a scene around the user 200. In one or more examples, the apparatus 100 may comprise part of a local user device 103 which may have the capability to provide for telecommunication with a remote user device 104, via a network 105, which may comprise a traditional telephone network, cellular telephone network or the Internet. The local user device 103 and/or remote user device 104 may comprise mobile telephones or any other telecommunication equipment. Thus, a first user may be able to communicate with a remote user using the devices 103, 104.

While the description that follows primarily describes the apparatus 100 as part of the local user device 103, it will be appreciated that the corresponding remote apparatus 102 may be provided as part of the remote user device 104 and may perform equivalent functions on audio content and information received from the apparatus that is remote thereto. In other examples, such as those outside the field of telecommunication, the remote apparatus 102 may not be part of a remote user device 104 and may comprises an audio content store or server (not shown) that provides the audio content to the apparatus 100. The remote apparatus 102, as a content store, may comprise a network-based content store or local content store.

The apparatus 100 and remote apparatus 102 may comprise or be connected to a processor 106 and a memory 107 and may be configured to execute computer program code. The apparatus 100 and/or remote apparatus 102 may have only one processor 106 and one memory 107 but it will be appreciated that other embodiments may utilise more than one processor and/or more than one memory (e.g. same or different processor/memory types). Further, the apparatus 100 and/or remote apparatus 102 may be an Application Specific Integrated Circuit (ASIC). In general terms, the apparatus 100 may comprise means, such as a processor and memory, configured to perform the functions defined herein.

The processor may be a general purpose processor dedicated to executing/processing information received from other components, such as audio content in accordance with instructions stored in the form of computer program code in the memory. The output signalling generated by such operations of the processor is provided onwards to further components 108, 109, such as to speakers, headphones, an amplifier or other audio presentation equipment (not shown) to present audio to the user. The further components 108, 109 may include one or more microphones or microphone arrays for capture of audio content for providing to the apparatus 100 or remote apparatus 102.

The memory 107 (not necessarily a single memory unit) is a computer readable medium (solid state memory in this example, but may be other types of memory such as a hard drive, ROM, RAM, Flash or the like) that stores computer program code. This computer program code stores instructions that are executable by the processor, when the program code is run on the processor. The internal connections between the memory and the processor can be understood, in one or more example embodiments, to provide an active coupling between the processor and the memory to allow the processor to access the computer program code stored on the memory.

In this example, the respective processors and memories are electrically connected to one another internally to allow for electrical communication between the respective components. In this example, the components are all located proximate to one another so as to be formed together as an ASIC, in other words, so as to be integrated together as a single chip/circuit that can be installed into an electronic device. In some examples one or more or all of the components may be located separately from one another.

The proliferation of high-quality spatial audio services, applications and devices capable of rendering the spatial audio content (e.g. head-tracked binaural audio optionally used in one or more embodiments) will likely lead to significant increase in their use. And vice versa, increased interest in immersive media will lead to more and more offerings in the market.

In one or more examples, with the presentation of immersive audio potentially comprising a plurality of audio streams perceived from a plurality of respective directions, the attention of a user may be grabbed by one or more of the audio streams more than the others. However, the way the audio streams are captured or mixed in the audio content may not provide for sufficiently clear and effective presentation of the audio content and interesting audio content can be missed or go unappreciated.

Example FIG. 2 shows a remote user 201 in an audio scene depicted by circle 202. The audio scene 202 in this example includes two audio sources comprising a first audio source 203 and a second audio source 204. The audio of the first audio source 203 may be captured as a first audio stream and the audio of the second audio source 204 may be captured as a second audio stream. The first and/or second audio stream may be an audio object stream, which will be described in more detail below. One or more of the audio streams may comprise an ambience stream.

The first and second audio streams may be provided to the apparatus 100 as first audio content from the remote apparatus 102. The first audio content may include location information, also termed directional information in some examples, that identifies one or both of the direction towards or location of one, some or all of the audio sources 203, 204 relative to a reference direction, such as relative to the straight ahead direction of the remote user 201, so that the scene 202 can be reproduced for the user 200.

Example FIG. 2 shows the user 200 being presented with an audio scene 205 by the apparatus 100 based on the first audio content received from the remote apparatus 102. Accordingly, the audio scene 202 of the remote user 201 is recreated for the user 200 by audio scene 205. The presented audio scene 205 may thus reproduce the "real" audio scene 202 by virtue of the presentation of the audio streams in accordance with the location information.

In particular, in one or more examples, the audio of the first audio source 203 is received from a direction slightly to the left of the remote user 201 and therefore the first audio stream is provided for presentation using spatial audio presentation techniques from a corresponding slightly to the left perceived-direction 206. Likewise, the audio of second audio source 204 is received from a direction on the right of the remote user 201 and therefore the second audio stream is provided for presentation using spatial audio presentation techniques from a corresponding right hand side perceived-direction 207. It will be appreciated that the "perceived-direction" comprises the direction from which a particular audio stream is to be perceived by virtue of the application of a spatial audio effect to said audio of the audio stream. In one or more examples, the first audio stream may be given more emphasis than the second audio stream in the first audio content, perhaps because it was louder or deemed more important for whatever reason. However, this may hinder the user experience for the user 200 who is interested in the audio of the second audio source 204 in addition to the first audio source 203. In other examples, the first and second audio stream may be presented similarly but the user may want to pay one of the audio streams more close attention (which may include by reviewing the content by looping, rewind or fast forward as will be described in more detail below).

The user 200 may wish is indicate that they have an interest in hearing the audio captured from the second audio source 204 with a greater fidelity or quality. If the data to provide such higher quality is available at the apparatus 100 in the first audio content, then the first audio content presented to the user 200 may be remixed accordingly. However, in one or more examples, such data is not available in the first audio content received by the apparatus 100 or is not available at least initially.

Figure 3:
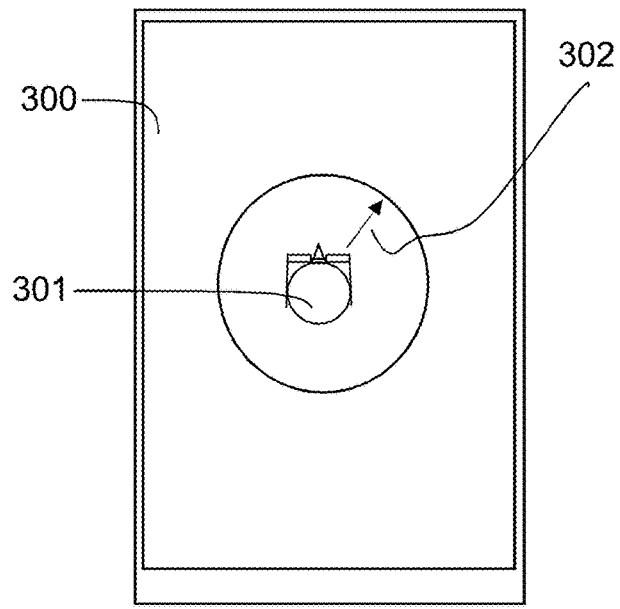
FIG. 3 illustrates an example user interface.

FIG. 3 shows the user 200 providing a user input to indicate which audio of the audio scene 205 they are interested in hearing at a higher quality. In this example, the user input is provided using a touch sensitive screen 300 of a mobile device. The apparatus 100 may provide for display of a reference point 301, such as a depiction of a plan view of the user's head. The user may then provide a user input 302 to indicate the direction from which they perceive the audio they are interested. In this example, the direction indicated by the user input 302 corresponds to the perceived-direction 207 (within a threshold) and thereby selects the second audio stream by virtue of the second audio stream being presented to be perceived from the perceived-direction 207. In one or more examples, the apparatus may display the direction from which the audio stream(s) are presented on the user interface, such as a touch sensitive screen 300, for user selection. In one or more examples, the user may select more than one audio stream.

While in this example, the user input is provided by a swipe gesture on a user interface comprising a touchscreen, other means for receiving the user input based on a gesture may be provided. A gesture may be an easy way for a direction to be indicated. However, the determination of the direction indicated by the user input 302 may be provided in one or more different ways as exemplified below. For example, by the determination of a direction of a swipe gesture on a user interface relative to a reference point, as exemplified above. In one or more examples, the determination of the direction of a free space gesture of a user 200 in a direction relative to said user 200 may be used. Accordingly, a camera or other sensor may be configured to detect free space user gestures and determine the direction of the gesture. In one or more examples, the determination of an orientation of an audio head set relative to the one or more perceived-directions of the audio streams may be used. Thus, the head set, such as earphones, headphones or more generally an orientation sensor thereof may indicate a direction for use as said user input. For example, the user may look toward the perceived-direction of the audio and provide an input. In one or more examples, the determination of an orientation of a virtual-or-augmented reality device relative to the one or more perceived-directions of the audio streams may be used and, as in the previous example, an orientation sensor, such as one or more accelerometers, of the virtual-or-augmented reality device may be used. In one or more examples, the determination of a direction in which the user 200 is looking may be used and therefore eye tracking cameras or sensors or head orientation sensors may yield a direction that may be correlated with the perceived-directions of the audio streams presented to the user 200. In one or more examples, the apparatus 100 may be configured to determine the direction by a voice command of the user.

Figure 4:
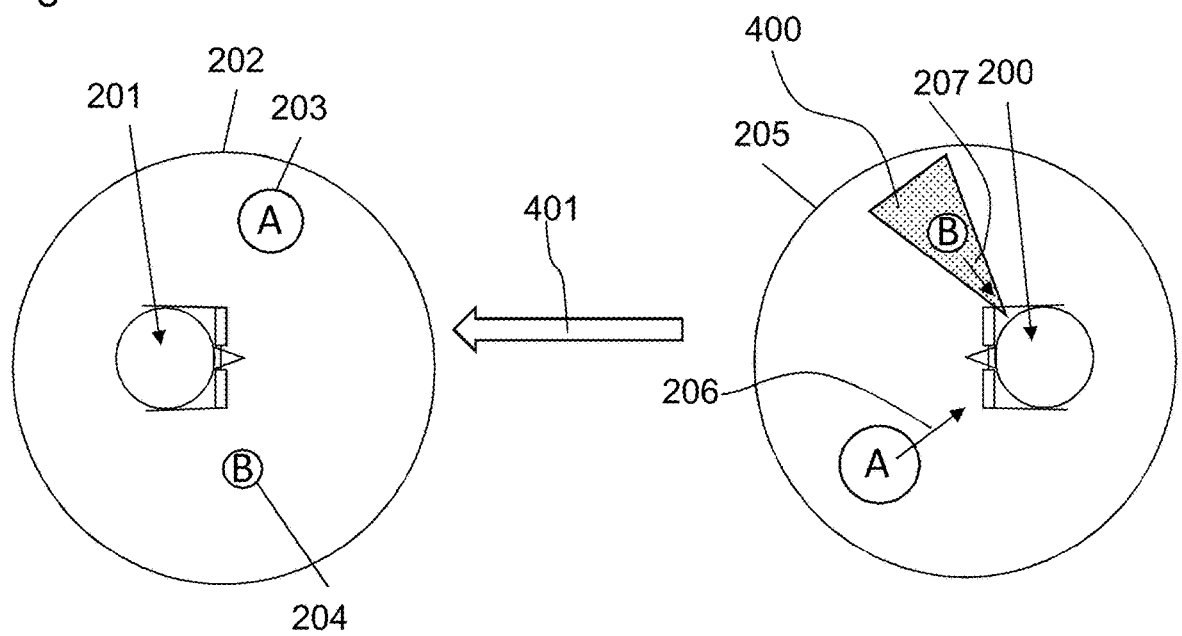
FIG. 4 illustrates an example plan view of a user of the apparatus and a user of the remote apparatus to illustrate from where they hear/perceive the audio of the audio streams and provide a user input.

FIG. 4 shows the direction of the user input 302 overlaid on the audio scene 205 as volume 400. The direction indicated by the user input is unlikely to precisely align with a perceived-direction and therefore a threshold, such as an angular threshold, around the direction of the input may be used to correlate with the perceived-directions 206, 207. The size of the volume 400 may represent the input direction and the angular threshold used in one or more examples. The volume 400 encompasses the perceived-direction 207 to illustrate that the second audio stream that comprises the audio of the second audio source 204 is selected by virtue of the direction of the user input 302 being with a threshold angle of perceived-direction 207. Accordingly, volume 400 also illustrates the selection of the second audio stream "B".

Thus, to summarise the functionality of the apparatus 100 thus far, the apparatus 100 may include means, such as the processor and memory and computer program code, to:

receive the first audio content from the remote apparatus 102, the audio content comprising at least one audio stream, that is the first and second audio streams representative of the audio from the audio sources 203, 204, wherein the or each audio stream is associated with respective location/directional information;

provide for presentation of the at least one audio stream as spatial audio such that the or each audio stream is to be perceived as originating from a respective perceived-direction 206, 207 based on the respective location/directional information;

determine at least one direction indicated by a user input 302, such as by a swipe gesture on the touch sensitive screen 300; and identify which of the perceived-directions 206, 207 of the audio streams correspond to the direction(s) determined from the user input to identify one of the at least one audio streams.

As mentioned above, the first audio content may not include the data to present the second audio stream with any higher quality. Accordingly, the apparatus 100 may be configured to send a message 401, as a response to the aforementioned selection of the second audio stream, to the remote apparatus 102 or "source" of the first audio content. The message may be considered to be a request for a higher quality or improved second audio stream. Accordingly, the message may include identifying information for the identified audio stream. The identifying information may comprise the perceived-direction 207 or reference to a unique identifier of the second audio stream provided in the first audio content.

Figure 5:
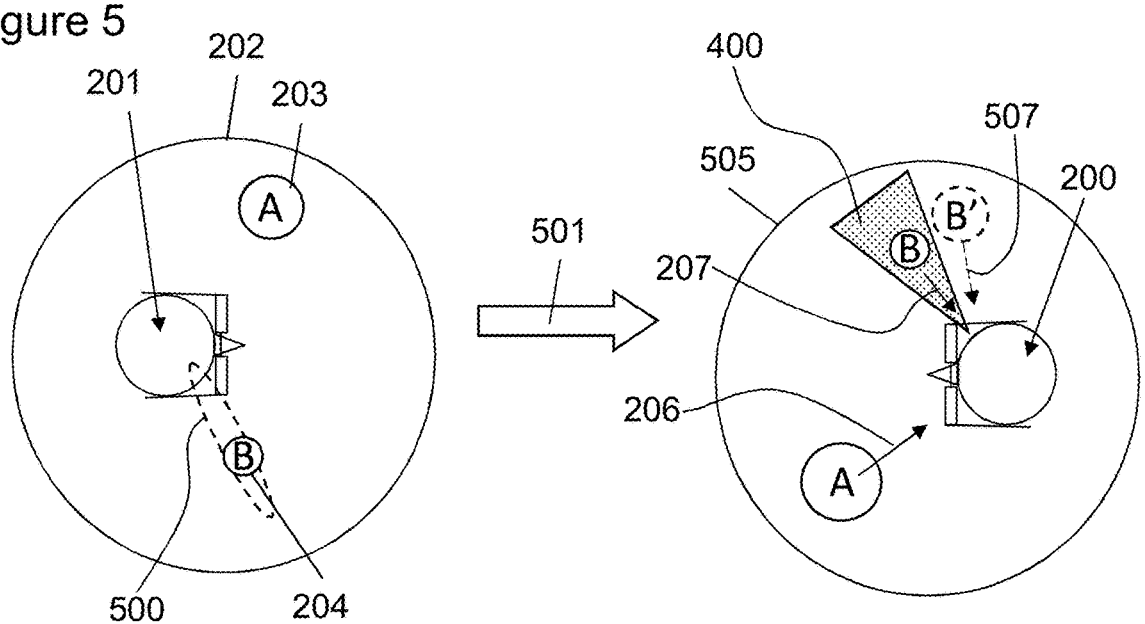
FIG. 5 illustrates an example plan view of a user of the apparatus and a user of the remote apparatus to illustrate from where they hear/perceive the audio of the audio streams of second audio content.

FIG. 5 shows the actions of the remote apparatus 102 in response to receipt of the message 401. In particular, the audio of the scene 202 is now captured and/or processed differently and/or transmitted to the apparatus in a different, higher quality, form. In one or more examples, the audio from the second audio source 204 is captured with a higher quality to obtain an enhanced version of the identified second audio stream.

The greater audio quality may be provided by one or both of: the way in which the audio is captured or the way the audio is processed following its capture, and prior to sending to the apparatus 100. In terms of the way it is processed, in one or more examples, the greater audio quality is provided by the audio content comprising audio sampled at a greater sample rate and/or the audio is encoded using a greater encoding bit-rate and/or the audio has an improved signal to noise ratio, such as by the application of noise removal algorithms, and/or the dynamic range of the audio is compressed less or expanded. In terms of the way the audio is captured, in one or more examples, the audio is captured in way that introduces less noise to improve the signal to noise ratio and/or a directional microphone is focused in the direction of the source of audio and/or a different audio capture apparatus is used that is capable of higher quality and/or higher microphone amplification settings are used at the time of capture.

For example, the volume levels used in an audio mix used for the first audio content may be modified such that a greater audio volume gain is applied to the audio of the second audio stream relative to the identified, non-enhanced, audio stream. In one or more examples, a greater audio encoding bit rate for the audio from the second audio source 204 may be used relative to the audio encoding bit rate used for the audio of the identified, non-enhanced, audio stream of the first audio content. In one or more examples, the message may provide for the focusing of a directional microphone by the remote apparatus 102 toward said direction of the second audio source 204 for improved capture of audio to form the enhanced version of the second audio stream. In one or more examples, the technique of beamforming with a microphone array can be used to provide for improved capture of audio from a particular direction. FIG. 5 shows the direction of the beam 500 to illustrate the focus of a microphone array of the remote apparatus 102 to capture the audio of the second audio source 204. Such beamforming techniques are known from Mohammad J. Taghizadeh et al, "Microphone Array Beampattern Characterization for Hands-free Speech Applications", THE SEVENTH IEEE SENSOR ARRAY AND MULTICHANNEL SIGNAL PROCESSING WORKSHOP.

The one or more audio streams of the first audio content may or may not continue to be sent to the apparatus 100 by the remote apparatus 102. In this and one or more examples, the one or more audio streams of the first audio content continue to be sent to the apparatus 100 in the same or similar form as sent prior to receipt of message 401. In addition, second audio content may be provided by the remote apparatus 102 to the apparatus 100 comprising the enhanced version of the identified, second, audio stream. Thus, the second audio content may, in one or more examples, comprises the enhanced version of the identified audio stream and the first audio content continues to be sent to the apparatus 100. In one or more other examples, the second audio content provided in response to the transmitted message 401 replaces the first audio content and comprises the enhanced version of the identified audio stream and the at least one audio stream present in the first audio content including the identified, non-enhanced, audio stream. Thus, in this other example, the second audio content comprises the audio streams as originally mixed and the new enhanced version of the identified second audio stream.

FIG. 5 also shows the transmitting and receipt, at 501, of the second audio content and the first audio content by the apparatus 100 and its presentation in the audio scene 505 for user 200.

The previously presented audio scene 205 continues to be presented in this and one or more examples. Accordingly, the first audio stream which represents the first audio source 203 is presented with a perceived-direction 206 and the second audio stream which comprises the audio captured from the second audio source 204 is presented with a perceived-direction 207. The audio scene 505 shown in FIG. 5 differs in that an additional audio stream is presented comprising the enhanced version of the second audio stream.

So as not to overlap the perceived-direction 207 of the second audio stream with the second perceived-direction 507 of the enhanced version of the second audio stream, the perceived-directions 207, 507 are spatially offset from one another. Thus, in one or more examples, the enhanced version of the second audio stream is presented as spatial audio with the second perceived-direction 507 adjacent to but spatially, such as angularly, offset from the perceived-direction 207 used in the spatial audio presentation of the second audio stream.

In one or more examples, second perceived-direction 507 of the enhanced version of the second audio stream is determined based on the perceived-direction 207 plus a predetermined angular offset. In one or more other examples, the second perceived-direction 507 of the enhanced version of the second audio stream is determined based on the location information. In one or more other examples, the perceived-direction 207 of the non-enhanced audio stream is offset from the second perceived-direction 507 of the enhanced version of the second audio stream. Thus, the perceived-direction from which the second audio stream is to be perceived prior to the receipt of the presentation second audio content is used for the spatial audio presentation of the enhanced version of the identified second audio stream. Thus, the original, non-enhanced second audio stream may have its perceived-direction 207 modified in response to the presentation of the enhanced version of the identified second audio stream.

Accordingly, to summarise, the apparatus 100 may include means to receive the second audio content provided in response to the transmitted message 401 by the remote apparatus 102, the second audio content comprising an enhanced version of the identified audio stream, the enhanced version of the identified, second, audio stream having a greater audio quality than the identified, second, audio stream. Further, the apparatus 100 may include means configured to, in response the receiving the second audio content, continue to provide for presentation of the at least one audio stream that was received in the first audio content, such as without interruption. Said at least one audio stream may include the identified, second, audio stream. The presentation may comprise presentation as spatial audio such that the or each of the at least one audio stream is to be perceived as originating from the respective perceived-direction based on the respective location information. The apparatus 100 may further include means configured to, simultaneously, provide for presentation of the enhanced version of the identified audio stream as spatial audio such that it is to be perceived as originating from a second perceived-direction 507, wherein the perceived-direction 207 of the identified audio stream is offset from the second perceived-direction 507 of the enhanced version of the identified audio stream.

The user 200, following their user input to make the selection 400, may now be presented with a higher quality version of the audio from the second audio source.

In one or more examples, the apparatus 100 may be configured to determine how to offset the perceived-direction 207 of the identified audio stream from the second perceived-direction 507 of the enhanced version of the identified audio stream. However, in one or more other examples, the location information provided with the second audio content or first and second audio content may include location information for use in positioning the second perceived-direction 507 of the enhanced version of the identified audio stream. Accordingly, the remote apparatus 102 may be configured to instruct the apparatus 100 on where to position the second perceived-direction 507 of the enhanced version of the identified audio stream.

In one or more examples, the perceived-direction 207 of the identified audio stream is offset from the second perceived-direction 507 of the enhanced version of the identified audio stream to avoid a confusing presentation of two audio streams from the same perceived-direction. However, at times, the identified audio stream may be silent, perhaps because the second audio source 204 was not generating audio at that time or was generating low volume audio below a threshold level. Accordingly, in such circumstances there may be no need to offset the perceived-direction 207 and the second perceived-direction 507. Accordingly, in one or more examples, a status indication may be transmitted by the remote apparatus 102 to the apparatus 100 that is indicative of whether or not the audio of the identified audio stream is currently above a threshold level. The apparatus 100 may have means configured to, based on the status indication, position the second perceived-direction 507 in at least either an offset orientation or non-offset orientation. In particular, the apparatus 100 may be configured to, based on the status indication being indicative of the audio being below the threshold level, provide for presentation of the enhanced version of the identified audio stream as spatial audio such that it is to be perceived as originating from a perceived-direction 507 that is the same as the perceived-direction 207 of the identified audio stream or not excluded from overlapping with the perceived-direction 207. Further, the apparatus 100 may be configured to, based on the status indication being indicative of the audio being at or above the threshold level, provide for presentation of the enhanced version of the identified audio stream as spatial audio such that it is to be perceived as originating from a second perceived-direction 507 that is offset from the perceived-direction 207 of the identified audio stream, as described above. In one or more examples, if the status indication is indicative of the audio being below the threshold level, then the apparatus 100 may determine the second perceived-direction 507 without restriction of placement in the same direction of the perceived-direction 207 and in accordance with one or more other criteria.

In one or more examples, the enhanced version of the identified audio stream presented by the apparatus 100 is temporally offset from the identified audio stream such that said presentation of the enhanced version of the identified audio stream repeats audio, albeit at a higher quality, already provided for presentation from the identified audio stream. Accordingly, the enhanced version of the identified audio stream may be presented beginning from a time point in the past relative to the identified audio stream.

In one or more examples, the non-identified and non-enhanced audio streams may be paused and the enhanced version of the identified audio stream may be presented. Such presentation may be provided based on a user input indicating a desire to solely focus on the identified audio stream.

As described above, the enhanced version of the identified audio stream may be enhanced by it having a higher quality relative to the identified audio stream. However, it may be enhanced in other ways. For example, the enhanced version of the identified audio stream may be provided with controllable playback of the audio such that the temporal position during the enhanced version of the identified audio stream may be user controllable. In one or more examples, the default may be for the apparatus 100 to initially receive audio content having audio streams that have non-controllable playback but an enhanced version, when requested by way of message 401 and received at 501, does have said controllable playback of the audio.

In the example embodiments that follow, we describe example embodiments in which the temporal position during the audio stream may be user controllable. Thus, while the above example describes the provision of controllable playback of the time point in the audio stream in relation to the enhanced version of the identified audio stream, the provision of the controllable playback of the time point may be provided for any one or more of the audio streams of the first and/or second audio content. Further, it will be appreciated that in any of the examples described herein the first audio content and/or second audio content may comprise live captured content as exemplified in the above examples or it may comprise pre-recorded content. It will be appreciated that for live captured audio content, the past audio may be stored by the remote apparatus 102, apparatus 100 or other entity and may therefore be available for later playback by the apparatus 100, but future audio is not available, because it has not yet been captured. However, for pre-recorded audio content, then past audio and future audio for each audio stream may be available for playback relative to the currently presented time point in the audio streams of the audio content. For pre-recorded content, the remote apparatus 102 may comprise an audio content store from which the apparatus 100 may request audio content and be sent audio content in response to said one or more requests.

Figure 6:
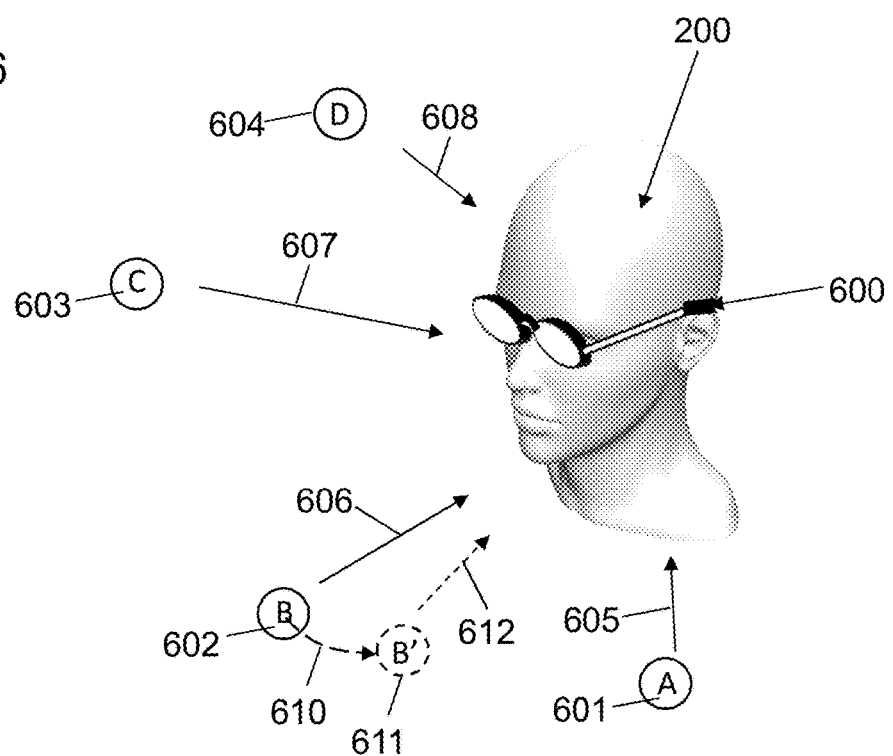
FIG. 6 illustrates a first example perspective view of where a user is to perceive audio streams based on movement of virtual objects.

FIG. 6 shows the user 200 wearing an augmented reality head set 600 with headphones for the presentation of spatial audio to the user 200 by apparatus 100. The audio content in this, and one or more other examples, comprises a plurality, such as four, audio streams and the perceived origin of the audio of the audio streams is represented by four circles 601-604 to illustrate from where the user 200 will perceive the audio. Accordingly, the audio content may include the aforementioned location information that establishes the direction and/or location from which the apparatus 100 should presented the audio content as spatial audio. The first audio stream, represented by first circle 601, may therefore be perceived as originating from a first perceived-direction 605. The second audio stream, represented by second circle 602, may therefore be perceived as originating from a second perceived-direction 606. The third audio stream, represented by third circle 603, may therefore be perceived as originating from a third perceived-direction 607. The fourth audio stream, represented by fourth circle 604, may therefore be perceived as originating from a fourth perceived-direction 608.

In one or more examples, the circles may comprise virtual objects 601-604 or "audio objects" that are provided with a location in the space around the user 200 and from which an associated audio stream is presented to be perceived as originating from that virtual object. The use of virtual objects to define the perceived origin of presented audio content may be familiar to those skilled in the art of spatial audio presentation. However, the presentation of the audio content using virtual objects or the encoding of the audio content to include virtual objects is not a requirement.

Thus, in a first example, the control of the playback of the time point will be described generally without reference to virtual objects and instead with reference to the perceived-directions 605-608.

In a first example, the apparatus 100 may be configured to receive a user input from the user 200, such as by way of a gesture, to select one of the audio streams. The user gesture may be convenient as the user 200 can select the audio stream using the direction from which they perceive the audio stream to be originating. The user input may be received in any of the ways defined above for identifying the audio stream.

Thus, the apparatus 100 may be configured to, based on the receipt of a gesture being directed in a direction corresponding to the perceived-direction 606 from which one of the audio streams is to be perceived when presented as spatial audio, select that audio stream. In the example of FIG. 6, the second circle 602 is shown as having been selected by way of the gesture being directed towards it and then the gesture has moved in the direction of arrow 610. Accordingly, the apparatus may be configured to determine the movement 610 as the direction in which the gesture subsequently moves following said selection of the second audio stream. This gesture may be understood as a grab and move gesture, in which a user virtually picks up the audio and moves it to a new location to be perceived from that new location.

This "virtual" selection and movement of the second audio stream from its original perceived-direction 606 may provide for presentation, such as by the apparatus 100, of the second audio stream from its new perceived-direction 612. The apparatus 100 may also be configured to receive the movement of the perceived-direction 606, 612 as an input to present the selected audio stream from a different time point during the audio stream.

From the point of view of the user 200, the movement 610 is to the left, which may be intuitively understood to move backward in time. Accordingly, the apparatus 100 may be configured to, based on said movement being in a direction to the left from the point of view of the user, provide for at least rewinding of the selected audio stream such that said presentation of the audio stream is provided from a prior point in time during said selected audio stream.

In other examples, the movement 610 may be to the right from the point of view of the user 200, which may be intuitively understood to move forward in time. Accordingly, the apparatus may be configured to, based on said movement being in a direction to the right from the point of view of the user, provide for at least temporally advancing of the selected audio stream such that said presentation of the audio stream is provided from a future point in time during said selected audio stream. It will be appreciated that the audio content may be pre-recorded in such a "fast forward" example.

It will be appreciated that different movement directions may be established for "rewinding" or "temporally regressing" or "fast forwarding" or "temporally advancing" the point in time of the playback of the audio stream.

In one or more examples, the means are configured to determine a measure or amount of the movement 610 of the gesture subsequent to said selection. The amount the gesture displaces the perceived-direction 606 to direction 612 may be configured to correspond to an amount of time during the audio stream. Thus, in one or more examples, the amount of rewinding of the selected audio stream is based on said measure such that the greater the measure of the movement 610 the greater the temporal amount the selected audio stream is rewound. Likewise, the smaller the movement 610 the smaller the temporal amount the selected audio stream is rewound. A corresponding approach may be used for temporally advancing the audio.

In one or more examples during the presentation of the selected (second) audio stream from its temporally advanced or temporally regressed time point, the apparatus 100 may be configured to continue to present the other audio streams. Further, the second audio stream, despite being the selected audio stream, may continue to be presented without a temporal change and from the perceived-direction 606 and, simultaneously, the apparatus 100 may be configured to present said "temporally modified" version of the second audio stream from the perceived-direction 612. During this presentation of the second audio stream from two different time points one of them may be reduced in volume relative to the other. For example, the non-temporally modified version may be presented with a reduced volume for the time that the "temporally modified" version of the selected, second, audio stream is presented. In other examples, one or more of the other, non-selected, audio streams may be paused for the time the apparatus 100 provides for presentation of the "temporally modified" selected audio stream.

In one or more examples, the apparatus 100 may be configured to provide for presentation of the selected audio stream beginning from the temporally regressed time point during the selected audio stream for a playback time period substantially equal to the amount of temporal regression. Thus, once the temporally regressed selected audio stream represented by circle 611 catches up with the time point that was presented when the user input was made, the apparatus 100 provides for ceasing of its presentation and continues with the presentation of the second audio stream as represented by circle 602. Such an implementation may allow for re-examination of particular audio of interest without adversely impacting the consumption experience of the rest of the audio scene.

As mentioned above, the apparatus 100 may be implemented to operate using virtual audio objects. Thus, the perceived-directions 605-608 of the audio streams are each associated with a respective virtual object 601-604 (similarly represented by the circles). Each virtual object may be provided with a location by the apparatus 100 that defines from where the respective audio stream is to be perceived when presented as spatial audio and thereby the virtual objects define the perceived-directions 605-608. Each of the virtual objects may have a first location, such as the location defined in the location information. When the virtual object 601-604 is located at the first location, the audio of the respective audio stream is presented from a first time point during the respective audio stream.

The apparatus 100 may have means configured to receive the user input that provides for selection and movement of one of the virtual objects to a second location, such as the location represented by circle 611. The apparatus 100 may be configured to determine a second time point during the selected, second, audio stream associated with the selected virtual object 602, the second location (shown by circle 611) defining said second time point and the second time point temporally spaced from the first time point. As mentioned above, the size of the displacement of the virtual object from the first location to the second location may be related to the amount of time the second audio stream is advanced or regressed. Thus, the apparatus 100 may provide for presentation of the second audio stream associated with the selected virtual object 602 as spatial audio such that it is to be perceived as originating from the second location (location of circle 611) and from the second time point during the audio stream.

Further, as mentioned above, the direction in which the virtual object is moved may be used by the apparatus 100 to determine whether to advance or regress the time point during the selected audio stream that is presented. In particular, based on a direction of movement from the first location to the second location being in a first direction (such as to the right from the point of view of the user 200), the second time point is determined as being temporally ahead of the first time point; and based on the direction of movement from the first location to the second location being in a second direction substantially opposite to the first direction (such as to the left from the point of view of the user 200), the second time point is determined as being temporally behind the first time point.

In one or more examples, the presentation of the selected, second audio stream first begins based on the ending of the user input gesture that provides for the movement 610.

Figure 7:
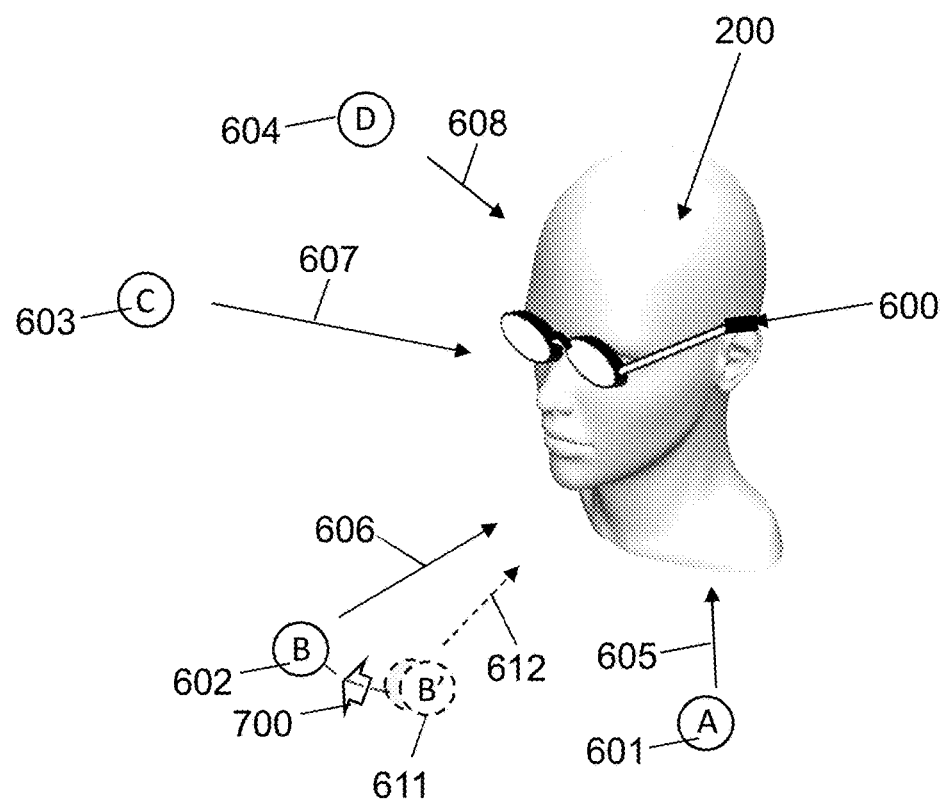
FIG. 7 illustrates a second example second perspective view of where a user is to perceive audio streams based on movement of virtual objects.

Example FIG. 7 shows the same arrangement as FIG. 6 at a time during the presentation of the "temporally modified" version of the selected, second, audio stream from the perceived-direction 612. In the example of FIG. 7, the apparatus 100 is configured to progressively move the location of the virtual object 611 (from which the temporally modified audio is perceived) along a path 700 toward the location of the virtual object 602 as the time point during the audio stream presented from the virtual object 611 catches up with the time point that was presented at the time the user input that made movement 610. Thus, the user 200 is able to re-experience the audio stream and the movement of its perceived-direction 612 provides an indication of the temporal progression of the presentation of the audio stream from its second time point back to the first time point. Thus, to summarise, the apparatus may comprise means configured to, as the presentation of the audio stream associated with the selected virtual object 602, 611 progresses, modify the location of the selected virtual object 611 such that a currently presented time point in the audio stream associated with the selected virtual object relative to the first time point is correspondingly indicated by the location of the virtual object 611 relative to the first position.

Figure 8:
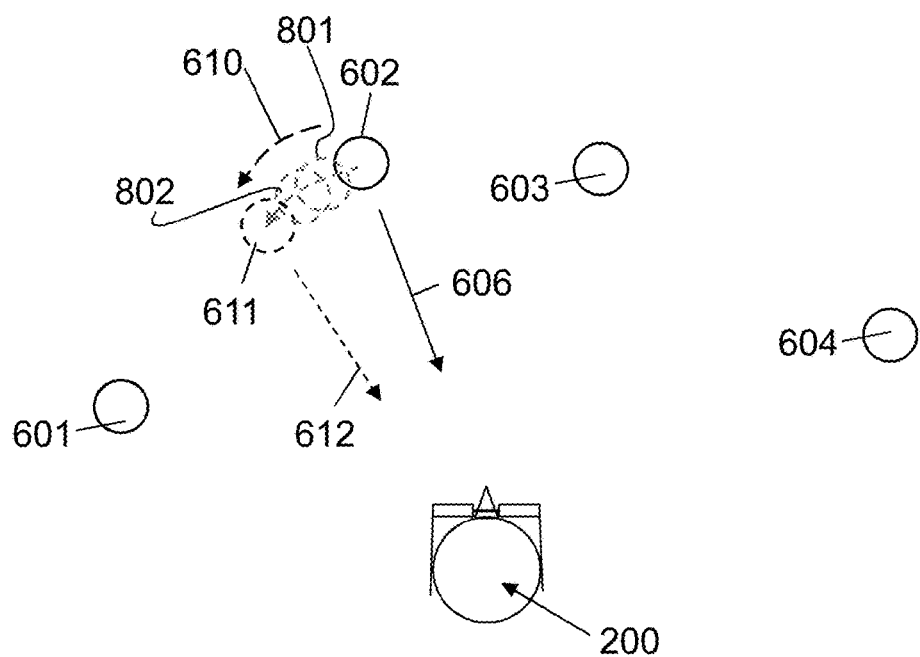
FIG. 8 illustrates a further example plan view of where a user is to perceive audio streams based on movement of virtual objects.

Example FIG. 8 shows the movement 610 of FIG. 6. It may be difficult for a user to know how much to move the virtual object to achieve a desired change in the temporal time point of the audio stream. Thus, in one or more examples, audio previews from different time points may be provided during the gesture input. In one or more examples, during the movement of the virtual object 602 by virtue of the continued user input gesture, portions of the audio of the selected, second audio stream may be provided for presentation, wherein the portions have a starting time point related to a current displacement of the movement 610 from the first location (shown by circle 602). Thus, the apparatus may comprise means configured to, during receipt of the user input to move the selected virtual object 602 to the second location, shown by circle 611, provide for presentation of at least a temporal portion of the audio stream associated with the selected virtual object, the temporal portion beginning at a time during the audio stream that is temporally between the first time point and the second time point and based on the spatial displacement of the virtual object 602 from the first location during the movement 610 provided. The temporal portions may comprise a short preview, such as of a duration of less than 2 second, 1.5 seconds, 1 second or half a second.

FIG. 8 shows two different spatial displacements 801 and 802 at which the apparatus may be configured to present said temporal portion or preview. Thus, as the movement 610 of the user input gesture reaches spatial displacement 801, a first temporal portion or "short audio clip" may be presented to audibly indicate how much the audio stream would be rewound if the user input gesture was ended at that spatial displacement 801. Further, as the movement 610 of the user input gesture reaches second spatial displacement 802, a second temporal portion or "short audio clip" may be presented to audibly indicate how much the audio stream would be rewound if the user input gesture was ended at that second spatial displacement 802. It will be appreciated that the time during the audio stream at which the second temporal portion begins is a different time (e.g. further back relative to the first time point but not as far back as the second time point) to the time during the audio stream at which the first temporal portion begins because the second spatial displacement 802 is further from the first location at 602 than the spatial displacement 801.

Accordingly, the control of the playback time point using the displacement of the virtual objects 601-604 from their initial location may provide an intuitive interface for controlling the temporal position of the playback of the associated audio stream.

Figure 9:
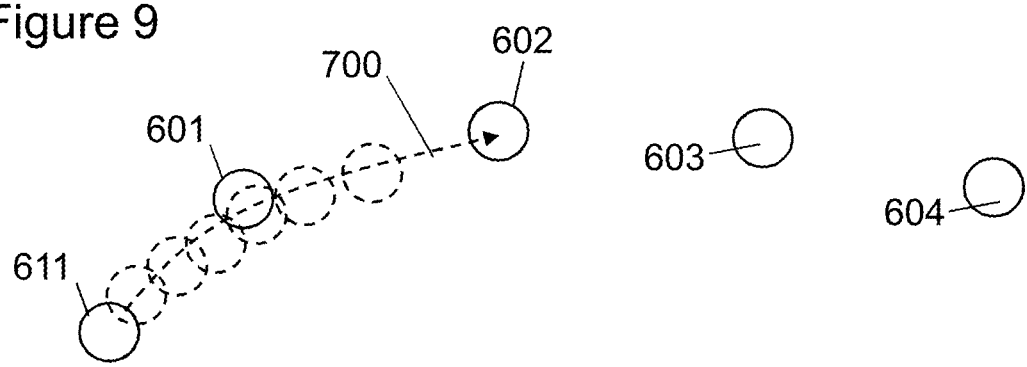
FIG. 9 illustrates a further example plan view of where a user is to perceive audio streams based on movement of virtual objects.
Figure 9:
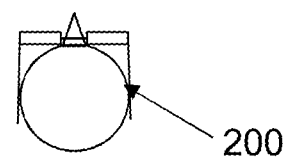

As described in relation to example FIG. 7, in one or more examples, the location of the virtual object 611 may be progressively moved as the associated audio is played back. Example FIG. 9 shows the same action, although in this example, the virtual object 602 was moved to the second location 611 such that the path 700 followed by the virtual object back to the first location at 602 will overlap with one (or more) of the other of the virtual objects. In this example, the path 700, from the point of view of the user 200, overlaps with the first virtual object 601.

Accordingly, in one or more examples, the apparatus 100 may be configured to determine which of the virtual objects lie within a threshold distance of a path from the second location to the first location to be followed by the selected virtual object during playback. In particular, the apparatus 100 may be configured to, based on determination of an overlap within a threshold distance between the selected virtual object as it is progressively moved, said overlap being with another of the virtual objects, provide for a temporary reduction in the volume with which the audio stream associated with said another of the virtual object is presented at least for a time said overlap, within a threshold distance, persists.

Thus, in the example of FIG. 9, as the virtual object 602 is progressively moved from the location represented at 611 back to 602, at the point it overlaps with the first virtual object 601, the first audio stream associated with the first audio object 601 may be presented with a lower volume. Once the virtual object 602 is progressively moved beyond the first virtual object 601, the first audio stream associated with the first audio object may be presented without the lower volume, such as returning to the volume prior to the overlap occurring. The lower volume may comprise muting or a non-muted volume.

Figure 10:
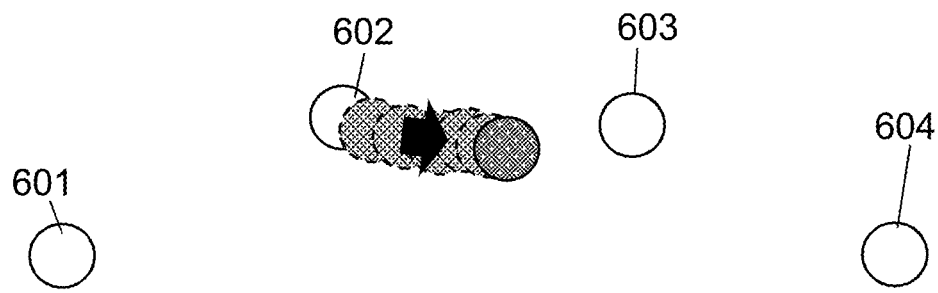
FIG. 10 illustrates a further example plan view of where a user is to perceive audio streams based on movement of virtual objects.
Figure 10:
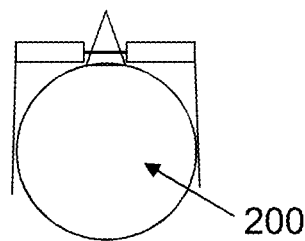

FIG. 10 show user input gesture moving the second virtual object to the right from the point of view of the user 200. In one or more examples described above a movement of the virtual object substantially to the right may result in the playback of the associated audio stream from a "fast forwarded" or temporally advanced time point. However, in this example and any other example herein, the movement substantially to the right (or any other predetermined direction) results in the audio stream associated with the virtual object that is moved to the right being muted for a "mute" period of time. The mute period of time may be predetermined, such as a fixed amount or may be based on the amount of the displacement of virtual object 602 from its initial location.

Thus, in one or more examples, the apparatus 100 may have means configured to:
  receive a user input that provides for selection and movement of one of the virtual objects from a first location to a second location;
  determine a mute period of time based on the distance between the first location and the second location;
  provide for muting of the presentation of the audio stream associated with the selected virtual object for the mute period of time.

Figure 11:
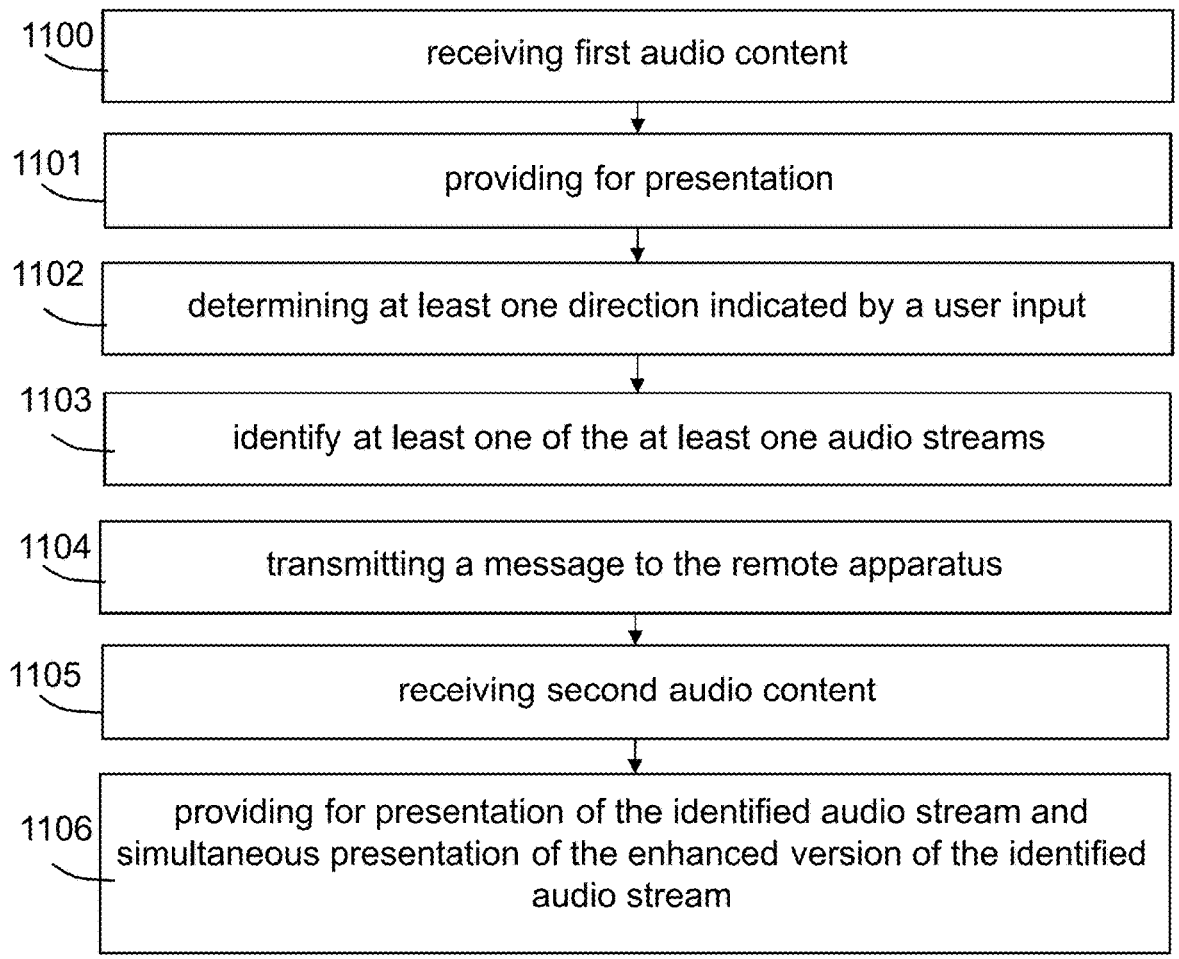
FIG. 11 shows a flowchart illustrating an example method.

FIG. 11 shows an example flow diagram illustrating the computer implemented steps of, receiving 1100 first audio content from a remote apparatus, the audio content comprising at least one audio stream, the or each audio stream associated with respective location information;
  providing 1101 for presentation of the at least one audio stream as spatial audio such that the or each audio stream is to be perceived as originating from a respective perceived-direction based on the respective location information;
  determining 1102 at least one direction indicated by a user input;
  identifying 1103 which of the one or more perceived-directions of the at least one audio streams correspond to the at least one direction determined from the user input to identify at least one of the at least one audio streams;
  transmitting 1104 a message to the remote apparatus, the message including at least identifying information for the at least one identified audio stream;
  receiving 1105 second audio content provided in response to the transmitted message by the remote apparatus, the second audio content comprising an enhanced version of the at least one identified audio stream, the enhanced version of the identified audio stream having a greater audio quality than the identified audio stream;
  providing 1106 for presentation of the at least one audio stream, including the identified audio stream, as spatial audio such that the or each audio stream is to be perceived as originating from the respective perceived-direction based on the respective location information and the simultaneous presentation of the enhanced version of the identified audio stream as spatial audio such that it is to be perceived as originating from a second perceived-direction, wherein the perceived-direction of the identified audio stream is offset from the second perceived-direction of the enhanced version of the identified audio stream.

Figure 12:
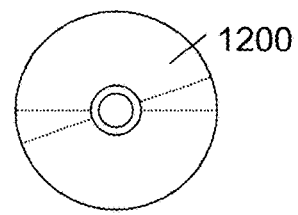
FIG. 12 shows a computer readable medium.

FIG. 12 illustrates schematically a computer/processor readable medium 1200 providing a program according to an example. In this example, the computer/processor readable medium is a disc such as a digital versatile disc (DVD) or a compact disc (CD). In some examples, the computer readable medium may be any medium that has been programmed in such a way as to carry out an inventive function. The computer program code may be distributed between the multiple memories of the same type, or multiple memories of a different type, such as ROM, RAM, flash, hard disk, solid state, etc.

User inputs may be gestures which comprise one or more of a tap, a swipe, a slide, a press, a hold, a rotate gesture, a static hover gesture proximal to the user interface of the device, a moving hover gesture proximal to the device, bending at least part of the device, squeezing at least part of the device, a multi-finger gesture, tilting the device, or flipping a control device. Further the gestures may be any free space user gesture using the user's body, such as their arms, or a stylus or other element suitable for performing free space user gestures.

The apparatus shown in the above examples may be a portable electronic device, a laptop computer, a mobile phone, a Smartphone, a tablet computer, a personal digital assistant, a digital camera, a smartwatch, smart eyewear, a pen based computer, a non-portable electronic device, a desktop computer, a monitor, a smart TV, a server, a wearable apparatus, a virtual reality apparatus, or a module/circuitry for one or more of the same.

Any mentioned apparatus and/or other features of particular mentioned apparatus may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some examples, a particular mentioned apparatus may be pre-programmed with the appropriate software to carry out desired operations, and wherein the appropriate software can be enabled for use by a user downloading a "key", for example, to unlock/enable the software and its associated functionality. Advantages associated with such examples can include a reduced requirement to download data when further functionality is required for a device, and this can be useful in examples where a device is perceived to have sufficient capacity to store such pre-programmed software for functionality that may not be enabled by a user.

Any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

Any "computer" described herein can comprise a collection of one or more individual processors/processing elements that may or may not be located on the same circuit board, or the same region/position of a circuit board or even the same device. In some examples one or more of any mentioned processors may be distributed over a plurality of devices. The same or different processor/processing elements may perform one or more functions described herein.

The term "signalling" may refer to one or more signals transmitted as a series of transmitted and/or received electrical/optical signals. The series of signals may comprise one, two, three, four or even more individual signal components or distinct signals to make up said signalling. Some or all of these individual signals may be transmitted/received by wireless or wired communication simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/examples may consist of any such individual feature or combination of features. In view of the foregoing description it will be evident to a person skilled in the art that various modifications may be made within the scope of the disclosure.

While there have been shown and described and pointed out fundamental novel features as applied to examples thereof, it will be understood that various omissions and substitutions and changes in the form and details of the devices and methods described may be made by those skilled in the art without departing from the scope of the disclosure. For example, it is expressly intended that all combinations of those elements and/or method steps which perform substantially the same function in substantially the same way to achieve the same results are within the scope of the disclosure. Moreover, it should be recognized that structures and/or elements and/or method steps shown and/or described in connection with any disclosed form or examples may be incorporated in any other disclosed or described or suggested form or example as a general matter of design choice. Furthermore, in the claims means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures.

The invention claimed is:

1. An apparatus comprising
at least one processor; and
at least one memory including computer program code;
the at least one memory and the computer program code configured to, with the at least one processor, cause the apparatus at least to perform:
    receive first audio content from a remote apparatus, the audio content comprising at least one audio stream associated with respective location information;
    provide for presentation of the at least one audio stream as spatial audio such that the at least one audio stream is to be perceived as originating from a respective perceived-direction based on the respective location information;
    determine at least one direction indicated by a user input;
    identify which of the one or more perceived-directions of the at least one audio streams correspond to the at least one direction determined from the user input to identify at least one of the at least one audio streams;
    transmit a message to the remote apparatus, the message including at least identifying information for the at least one identified audio stream;
    receive second audio content provided in response to the transmitted message by the remote apparatus, the second audio content comprising an enhanced version of the at least one identified audio stream, the enhanced version of the identified audio stream having a greater audio quality than the identified audio stream;
    provide for presentation of the at least one audio stream, including the identified audio stream, as spatial audio such that the at least one audio stream is to be perceived as originating from the respective perceived-direction based on the respective location information and the simultaneous presentation of the enhanced version of the identified audio stream as spatial audio such that it is to be perceived as originating from a second perceived-direction, wherein the perceived-direction of the identified audio stream is offset from the second perceived-direction of the enhanced version of the identified audio stream.

2. The apparatus of claim 1, wherein the enhanced version of the at least one identified audio stream comprises audio captured from a direction relative to the remote apparatus that corresponds to the direction indicated by a user input and wherein said greater audio quality is provided by at least one of:
    a greater audio encoding bit rate for audio captured from said direction relative to an audio encoding bit rate used for the audio of the identified, non-enhanced, audio stream; and
    the focusing of a directional microphone toward said direction for capture of audio to form the enhanced version of the identified audio stream;
    a greater sample rate for audio captured from said direction relative to a sample rate used for the audio of the identified, non-enhanced, audio stream
    an improved signal to noise ratio by the application of a noise removal algorithm for audio captured from said direction relative to a signal to noise ratio of the audio of the identified, non-enhanced, audio stream;

a dynamic range of the audio being compressed less or expanded for audio captured from said direction relative to the dynamic range of the audio of the identified, non-enhanced, audio stream;

the capture of audio in way that introduces less noise to improve the signal to noise ratio for audio captured from said direction relative to a signal to noise ratio of the audio of the identified, non-enhanced, audio stream; or a greater audio volume gain applied to the audio in said direction relative to the identified, non-enhanced, audio stream.

3. The apparatus of claim 1, wherein the enhanced version of the identified audio stream of the second audio content includes associated location information, the location information indicative of a direction from which said enhanced version of the identified audio stream is to be perceived as originating when presented as spatial audio, said location information defining the second perceived-direction that is offset from the perceived-direction of the identified audio stream.

4. The apparatus of claim 1, wherein the apparatus is further configured to:

receive a status indication indicative of whether the audio of the identified audio stream is currently above a threshold level; and based on the status indication being indicative of the audio being below the threshold level, provide for presentation of the enhanced version of the identified audio stream as spatial audio such that it is to be perceived as originating from a perceived-direction that is the same as the perceived-direction of the identified audio stream; or based on the status indication being indicative of the audio being above the threshold level, provide for presentation of the enhanced version of the identified audio stream as spatial audio such that it is to be perceived as originating from a perceived-direction that is offset from the perceived-direction of the identified audio stream.

5. The apparatus of claim 1, wherein the enhanced version of the identified audio stream is temporally offset from the identified audio stream such that said presentation of the enhanced version of the identified audio stream repeats audio already provided for presentation from the identified audio stream.

6. The apparatus of claim 1, wherein the determination of a direction indicated by the user input comprises at least one of:

the determination of a direction of a swipe gesture on a user interface relative to a reference point;

the determination of a direction of a free space gesture of a user in a direction relative to said user;

the determination of an orientation of an audio head set relative to the one or more perceived-directions of the audio streams;

the determination of an orientation of a virtual-or-augmented reality device relative to the one or more perceived-directions of the audio streams;

the determination of a direction in which a user is looking; or the determination of a direction indicated by a voice command.

7. The apparatus of claim 1, wherein the apparatus is further configured to:

receive a user input comprising a gesture;

select one of the at least one streams based on the gesture being directed in a direction corresponding to the perceived-direction from which that selected audio stream is to be perceived when presented as spatial audio;

determine a movement comprising the direction in which the gesture moves following said selection to cause at least rewinding of the selected audio stream such that said presentation of the audio stream is provided from a prior point in time during said selected audio stream.

8. The apparatus of claim 1, wherein the perceived-direction of each of the audio streams is defined by a respective virtual object, each virtual object thereby having a location that defines from where the respective audio stream is to be perceived when presented as spatial audio, wherein the location of the virtual object defines a time point during the associated audio stream that is presented, wherein the apparatus is further configured to:

provide for presentation of the respective audio stream from a first time point during the audio stream based on the virtual object having a first location;

receive a user input that provides for selection and movement of one of the virtual objects to a second location;

determine a second time point during the selected audio stream associated with the selected virtual object, the second location defining said second time point and the second time point temporally spaced from the first time point; and provide for presentation of the audio stream associated with the selected virtual object as spatial audio such that it is to be perceived as originating from the second location and from the second time point during the audio stream.

9. The apparatus of claim 8, wherein the spatial distance between the first location and the second location determines the temporal distance between the first time point and the second time point, such that the greater the spatial distance the greater the temporal distance.

10. The apparatus of claim 8, wherein based on a direction of movement from the first location to the second location being in a first direction, the second time point is temporally ahead of the first time point; or based on the direction of movement from the first location to the second location being in a second direction substantially opposite to the first direction, the second time point is temporally behind the first time point.

11. The apparatus of claim 8, wherein said presentation of the audio stream associated with the selected virtual object is provided simultaneously with the presentation of the at least one other audio streams of at least one of the first audio content or the second audio content.

12. The apparatus of claim 8, wherein during said presentation of the audio stream associated with the selected virtual object the presentation of other audio streams of at least one of the first audio content or the second audio content is paused.

13. The apparatus of claim 12, wherein the apparatus is further configured to, as the presentation of the audio stream associated with the selected virtual object progresses, modify the location of the selected virtual object such that a currently presented time point in the audio stream associated with the selected virtual object relative to the first time point is correspondingly indicated by the location of the virtual object relative to the first position.

14. A method, the method comprising:
  receiving first audio content from a remote apparatus, the audio content comprising at least one audio stream, the or each audio stream associated with respective location information;
  providing for presentation of the at least one audio stream as spatial audio such that the or each audio stream is to be perceived as originating from a respective perceived-direction based on the respective location information;
  determining at least one direction indicated by a user input;
  identifying which of the one or more perceived-directions of the at least one audio streams correspond to the at least one direction determined from the user input to identify at least one of the at least one audio streams;
  transmitting a message to the remote apparatus, the message including at least identifying information for the at least one identified audio stream;
  receiving second audio content provided in response to the transmitted message by the remote apparatus, the second audio content comprising an enhanced version of the at least one identified audio stream, the enhanced version of the identified audio stream having a greater audio quality than the identified audio stream; and
  providing for presentation of the at least one audio stream, including the identified audio stream, as spatial audio such that the or each audio stream is to be perceived as originating from the respective perceived-direction based on the respective location information and the simultaneous presentation of the enhanced version of the identified audio stream as spatial audio such that it is to be perceived as originating from a second perceived-direction, wherein the perceived-direction of the identified audio stream is offset from the second perceived-direction of the enhanced version of the identified audio stream.

15. The method of claim 14, wherein the enhanced version of the at least one identified audio stream comprises audio captured from a direction relative to the remote apparatus that corresponds to the direction indicated by a user input and wherein said greater audio quality is provided by at least one of:
  a greater audio encoding bit rate for audio captured from said direction relative to an audio encoding bit rate used for the audio of the identified, non-enhanced, audio stream; and
  the focusing of a directional microphone toward said direction for capture of audio to form the enhanced version of the identified audio stream;
  a greater sample rate for audio captured from said direction relative to a sample rate used for the audio of the identified, non-enhanced, audio stream
  an improved signal to noise ratio by the application of a noise removal algorithm for audio captured from said direction relative to a signal to noise ratio of the audio of the identified, non-enhanced, audio stream;
  a dynamic range of the audio being compressed less or expanded for audio captured from said direction relative to the dynamic range of the audio of the identified, non-enhanced, audio stream;
  the capture of audio in way that introduces less noise to improve the signal to noise ratio for audio captured from said direction relative to a signal to noise ratio of the audio of the identified, non-enhanced, audio stream; or
  a greater audio volume gain applied to the audio in said direction relative to the identified, non-enhanced, audio stream.

16. The method of claim 14, wherein the enhanced version of the identified audio stream of the second audio content includes associated location information, the location information indicative of a direction from which said enhanced version of the identified audio stream is to be perceived as originating when presented as spatial audio, said location information defining the second perceived-direction that is offset from the perceived-direction of the identified audio stream.

17. The method of claim 14, wherein the method further comprises:
  receiving a status indication indicative of whether the audio of the identified audio stream is currently above a threshold level; and
  based on the status indication being indicative of the audio being below the threshold level, providing for presentation of the enhanced version of the identified audio stream as spatial audio such that it is to be perceived as originating from a perceived-direction that is the same as the perceived-direction of the identified audio stream; or
  based on the status indication being indicative of the audio being above the threshold level, providing for presentation of the enhanced version of the identified audio stream as spatial audio such that it is to be perceived as originating from a perceived-direction that is offset from the perceived-direction of the identified audio stream.

18. The method of claim 14, wherein the enhanced version of the identified audio stream is temporally offset from the identified audio stream such that said presentation of the enhanced version of the identified audio stream repeats audio already provided for presentation from the identified audio stream.

19. The method of claim 14, wherein the determination of a direction indicated by the user input comprises at least one of: the determination of a direction of a swipe gesture on a user interface relative to a reference point; the determination of a direction of a free space gesture of a user in a direction relative to said user; the determination of an orientation of an audio head set relative to the one or more perceived-directions of the audio streams; the determination of an orientation of a virtual-or-augmented reality device relative to the one or more perceived-directions of the audio streams; the determination of a direction in which a user is looking; or the determination of a direction indicated by a voice command.

20. A non-transitory computer readable medium comprising program instructions stored thereon for performing at least the following:
  receiving first audio content from a remote apparatus, the audio content comprising at least one audio stream, the or each audio stream associated with respective location information;
  providing for presentation of the at least one audio stream as spatial audio such that the or each audio stream is to be perceived as originating from a respective perceived-direction based on the respective location information;
  determining at least one direction indicated by a user input;
  identifying which of the one or more perceived-directions of the at least one audio streams correspond to the at least one direction determined from the user input to identify at least one of the at least one audio streams;

transmitting a message to the remote apparatus, the message including at least identifying information for the at least one identified audio stream;

receiving second audio content provided in response to the transmitted message by the remote apparatus, the second audio content comprising an enhanced version of the at least one identified audio stream, the enhanced version of the identified audio stream having a greater audio quality than the identified audio stream;

providing for presentation of the at least one audio stream, including the identified audio stream, as spatial audio such that the or each audio stream is to be perceived as originating from the respective perceived-direction based on the respective location information and the simultaneous presentation of the enhanced version of the identified audio stream as spatial audio such that it is to be perceived as originating from a second perceived-direction, wherein the perceived-direction of the identified audio stream is offset from the second perceived-direction of the enhanced version of the identified audio stream.

* * * * *